United States Patent [19]
Gay

[11] 3,962,650
[45] June 8, 1976

[54] INTEGRATED CIRCUIT AMPLIFIER HAVING CONTROLLED GAIN AND STABLE QUIESCENT OUTPUT VOLTAGE LEVEL

[75] Inventor: Michael J. Gay, Geneva, Switzerland

[73] Assignee: Motorola, Inc., Chicago, Ill.

[22] Filed: Apr. 25, 1975

[21] Appl. No.: 571,809

Related U.S. Application Data

[63] Continuation of Ser. No. 417,854, Nov. 21, 1973, abandoned.

[52] U.S. Cl. ............................... 330/29; 307/264; 330/30 D
[51] Int. Cl.² ......................................... H03G 3/00
[58] Field of Search ..................... 330/29, 30 D; 307/235 R, 264

[56] References Cited
UNITED STATES PATENTS

| | | | |
|---|---|---|---|
| 3,310,688 | 3/1967 | Ditkofsky | 330/30 D |
| 3,538,448 | 11/1970 | Harford | 330/29 |
| 3,641,450 | 2/1972 | Lunn | 330/29 |
| 3,717,821 | 2/1973 | Amemiya et al. | 330/30 D |
| 3,764,931 | 10/1973 | Waku et al. | 330/29 |

*Primary Examiner*—John Zazworsky
*Attorney, Agent, or Firm*—Michael D. Bingham; Maurice J. Jones, Jr.; Harry M. Weiss

[57] ABSTRACT

The disclosed amplifier has a simple structure which is particularly suited for integrated circuit applications. The amplifier includes a differential amplifier having first and second input terminals across which an input signal is developed. Diodes are connected from each of the input terminals to a circuit node. A reference signal is coupled to the input terminals of the differential amplifier and hence to the diodes. A gain control transistor is connected between the circuit node and ground. The conductance of the gain control transistor varies in response to a gain control signal to thereby control the conductance of the diodes. As the conductances of the diodes increase, less of the input signal voltage is developed across the diodes and hence the gain is decreased and vice versa. The d.c. output voltage remains constant even though the gain is changed.

16 Claims, 4 Drawing Figures

INTEGRATED CIRCUIT AMPLIFIER HAVING CONTROLLED GAIN AND STABLE QUIESCENT OUTPUT VOLTAGE LEVEL

This is a continuation of application Ser. No. 417,854, filed Nov. 21, 1973, and now abandoned.

BACKGROUND OF THE INVENTION

Amplifiers having gains which are controlled by the magnitude of a control signal are utilized in a variety of applications. More specifically, quadraphonic-stereo systems, for instance, sometimes include voltage controlled amplifiers (V.C.A.) which must provide an output signal having an amplitude which is a function of a control signal. Also, such amplifiers can be used in automatic gain control (A.G.C.) circuits which provide an output signal having a constant amplitude even though the input signal magnitude varies. A.G.C. circuits have decreased gain in response to a control signal magnitude indicating that the amplitude of the output signal is tending to increase and an increased gain in response to a control signal magnitude indicating that the amplitude of the output signal is tending to decrease.

Some prior art A.G.C. and V.C.A. circuit configurations have signal transfer characteristics which are linear enough for amplifying signals having small amplitudes on the order of millivolts but which are too nonlinear for amplifying signals having large amplitudes on the order of volts as used in high quality sound reproducing equipment. Moreover, other prior art A.G.C. and V.C.A. circuits, while providing sufficiently linear signal transfer characteristics, allow the quiescent or direct current (d.c.) component of the output voltage at an output terminal thereof to change with variation in the magnitude of the gain control signal. These output voltage variations result in unwanted sounds being produced by loud speaker systems. Moreover, the resulting shift in the output voltage level complicates the design of subsequent stages being driven by the gain controlled amplifier. Also the shift in output voltage level restricts the maximum excursion that the output voltage can have without being distorted.

In response to the present emphasis on miniaturization and because of many known advantages of integrated circuits, such as reliability, cost reduction and compactness, it is desired to provide gain controlled circuits in monolithic form. Prior art gain controlled circuits requiring coupling capacitors do not lend themselves to direct coupling to other stages which is desired in integrated circuit design. Furthermore, prior art integrated circuits providing gain control also sometimes include differential current sources requiring a plurality of active components. It is desirable to reduce the number of active components in integrated circuit structures to improve yield and thus reduce the cost so long as the elimination does not adversely affect circuit performance. Also some prior art integrated gain controlled amplifiers are not suitable for being driven by a single-ended input signal thereby decreasing their usefulness in many applications.

SUMMARY OF THE INVENTION

One object of this invention is to provide an improved amplifier circuit having a gain which is determined by the magnitude of a control signal.

Another object of this invention is to provide an amplifier circuit having a controllable gain and a substantially linear signal transfer chracteristic for input signals having large amplitudes.

Still another object of this invention is to provide an amplifier circuit having a gain determined by a control signal and a direct current output voltage level which remains constant while the magnitude of the gain is varied.

A further object of the invention is to provide a gain controlled amplifier circuit which provides an output signal having a substantially constant maximum excursion even while the gain of the amplifier is being varied.

A still further object of the invention is to provide a configuration for an amplifier circuit having a gain which is a function of the magnitude of a control signal and which has a simple configuration that is particularly suited for manufacture in integrated circuit form.

An additional object of this invention is to provide an amplifier having a controllable gain and which is suitable for providing a double-ended output signal in response to a single-ended input signal.

Further objects, features and advantages of the invention will become apparent to those skilled in the art upon the consideration of the detailed description in conjunction with the drawings which depict an illustrative embodiment of the invention.

The composite gain controlled amplifier, in accordance with the invention, has a gain which is responsive to a gain control signal developed at a control terminal thereof. The composite amplifier includes a differential amplifier and a gain control circuit. The differential amplifier has first and second transistors and a current source. The gain control circuit includes first and second diodes and a gain control transistor. The first diode is connected between a control electrode of the first transistor and a circuit node and the second diode is connected between a control electrode of the second transistor and the circuit node. The gain control transistor is connected between the circuit node and a ground terminal. A reference supply is connected to the control electrodes of the differential amplifier transistors through resistors and hence supplies current through the diodes. As the conductance of the control transistor is varied by a gain control signal, the magnitudes of the currents through the diodes are varied to thereby change their resistances. As the resistance of the diodes is decreased, less of the input signal voltage is developed across the diodes thereby decreasing the gain of the composite amplifier. Alternatively, if the current through the diodes is decresed, their resistances increase thereby causing more of the input signal voltage to be coupled to the differential amplifier which increases the gain of the composite circuit. The quiescent or d.c. output voltage of the differential amplifier is controlld by the current source. Thus, the d.c. output voltage remains constant even though the gain varies.

DETAILED DESCRIPTION OF THE PREFERRED EMBODIMENT

Figure 1:
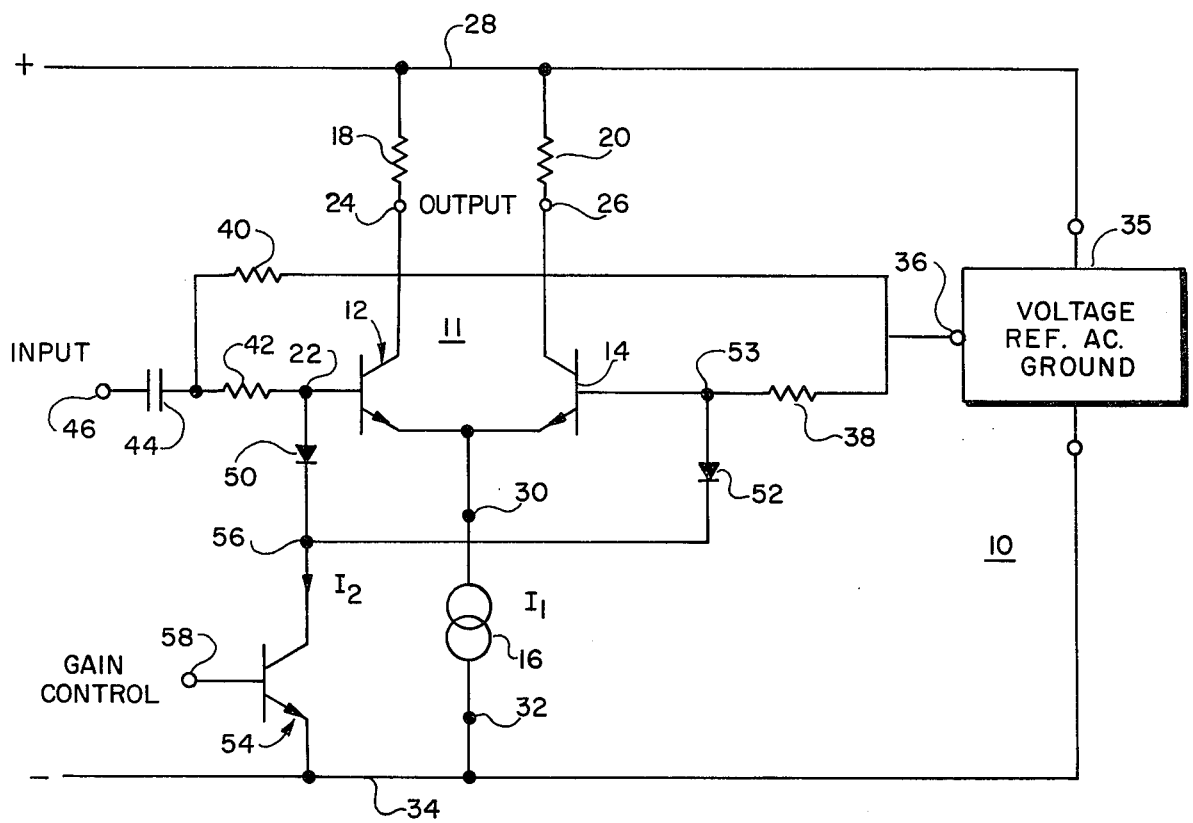
FIG. 1 is a schematic diagram illustrating a gain controlled amplifier of one embodiment of the invention.
Figure 4:
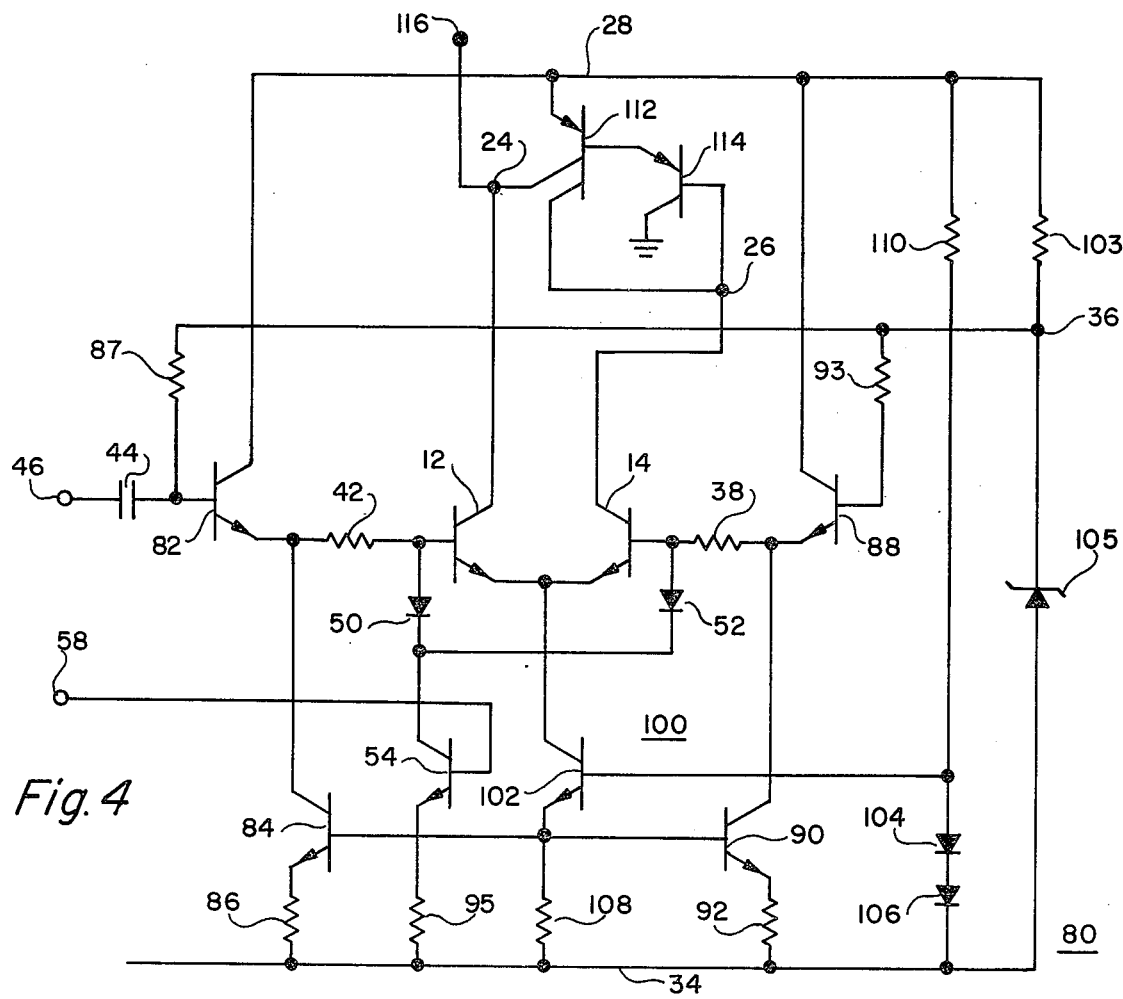
FIG. 4 is a schematic diagram of an improved version of the circuit of FIG. 1.

FIG. 1 is a schematic diagram of a gain controlled amplifier 10 in accordance with one embodiment of the invention. NPN transistors 12 and 14, current source 16 and load resistors 18 and 20 provide differential amplifier 11 of known configuration. Differential amplifier 11 has single-ended input terminal 22, which is connected to the base electrode of transistor 12, and double-ended output terminals 24 and 26 which are respectively connected to the collector electrodes of transistors 12 and 14. Load resistors 18 and 20 connect output terminals 24 and 26 to positive power supply conductor 28. In some applications, load resistors 18 and 20 can be replaced with a balanced-to-unbalanced converter, as shown in FIG. 4. Terminal 30 of current source 16 is connected to the emitter electrodes of transistors 12 and 14, which are tied together, and terminal 32 of current source 16 is connected to conductor 34 which provides a ground or other potential which is negative with respect to the potential applied to conductor 28.

Voltage supply 35 provides a positive reference voltage at output terminal 36 which has a magnitude that is less positive than the magnitude of the voltage applied to conductor 28 but more positive than the potential at conductor 34. Resistor 38 connects the base of transistor 14 to voltage reference terminal 36 and resistors 40 and 42 connect the base of transistor 12 to voltage reference terminal 36. Coupling capacitor 44 couples input terminal 46 of gain controlled amplifier 10 to the junction of resistors 40 and 42. It is desirable to keep the quiescent voltage at the base of transistor 12 equal to the quiescent voltage at the base of transistor 14. This is accomplished by making the sum of the values of resistors 40 and 42 equal to the value of resistor 38. If the quiescent voltages at the bases of transistors 12 and 14 are unequal, the difference in voltage levels would in effect operate as an undesired input signal which would result in undesired collector currents and output voltages.

Gain control is performed by a combination of diodes 50 and 52 and gain control transistor 54. Diode 50 includes an anode electrode connected to differential amplifier input terminal 22 and a cathode electrode connected to circuit junction or node 56. Similarly, diode 52 includes an anode electrode connected to the base electrode of transistor 14 and a cathode electrode connected to node 56. NPN transistor 54 includes an emitter electrode connected to conductor 34, a collector electrode connected to node 56 and a base electrode connected to terminal 58, at which a gain control signal is developed in a known manner. Diodes 50 and 52 can each be formed from a transistor having its collector and base electrodes connected together in a known manner.

If gain control transistor 54 is rendered nonconductive by the gain control signal applied to control terminal 58, which would be the condition for maximum gain, diodes 50 and 52 have virtually no affect on the operation of gain controlled amplifier 10. In this "maximum gain" mode of operation, an alternating current (a.c.) input signal applied between input terminal 46 and ground 34 is coupled by capacitor 44 and resistor 42 to differential amplifier input terminal 22. The input signal is then amplified by transistors 12 and 14 which provide an inverted output signal at the collector of transistor 12 and a non-inverted output signal at the collector of transistor 14. Hence, a balanced or double-ended output is obtained between terminals 24 and 26 in response to a single-ended input signal at terminal 46.

Since differential amplifier 11 is operated in the balanced or "push-pull" output mode, supply-voltage-ripple occurring between conductors 28 and 34 identically affects the output signals at terminals 24 and 26. Thus, the collector-to-collector output signal is not affected by ripple or other "common-mode" signals. The balanced output signal contains virtually no hum or ripple which is an advantage in low-noise applications. Current source or supply 16 draws a fixed amount of current, $I_1$, which is divided up between transistors 12 and 14 and which is virtually independent of the input or output signals. Thus, the input and output signals don't get into the power supply conductors. Because of the constant current drawn from conductor 28 and because the output signal of the differential amplifier is largely independent of the ripple, only a small amount of power supply filtering and decoupling is required. Moreover, the configuration of differential amplifier 11 lends itself to integrated circuit manufacture which results in transistors 12 and 14 having matched electrical characteristics.

Differential amplifier 11 can be designed to have a gain which is substantially independent of the common emitter current gain or beta of transistors 12 and 14. The differential voltage gain of differential amplifier 11 is the ratio of the magnitude of the input voltage to the magnitude of the output voltage. Assuming that control transistor 54 is nonconductive the voltage gain $Gv_1$ of amplifier 11 is expressed by the following known formula:

$$Gv_1 = \frac{V_L}{v_{bb}} = \frac{(R_{18} + R_{20}) I_1 q}{4kT} \qquad (1)$$

$k =$ Boltzmann's constant;
$T =$ absolute temperature;
$q =$ the magnitude of the electronic charge;
$v_{bb} =$ voltage between base electrodes of transistors 12 and 14; and
$V_L =$ voltage between output terminals 24 and 26.

Hence, the gain of differential amplifier 11, assuming control transistor 54 is nonconductive, is directly proportional to the magnitude of the current $I_1$ drawn by current source 16 and to the values of load resistors 18 and 20, which are usually equal to each other. As shown by equation 1, gain control can be provided, as is done in some prior art circuits, by varying the magnitude of current $I_1$. Such gain control while being satisfactory for some small signal amplifiers results in reduction of signal handling, as the gain is reduced, and variation in quiescent-output voltages.

If gain control transistor 54 is rendered conductive, then current from terminal 36 of reference supply 35 is conducted through diodes 50 and 52 and transistor 54 to ground. Since the resistances and impedances of diodes 50 and 52 are inversely proportional to the amount of current conducted by them, their resistances and impedances become less as transistor 54 is rendered more conductive by the gain control signal. Under dynamic conditions, as the conductivities of diodes 50 and 52 increase, the amount of the input signal voltage developed across the diodes is reduced.

Consequently, if an a.c. input voltage having a constant magnitude is applied to input terminal 46 and control transistor 54 is rendered increasingly more conductive, the magnitude of the input signal voltage created between differential amplifier input terminals 22 and 53, and the output signal between terminals 24 and 26 decreases. Alternatively, as control transistor 54 is rendered less conductive, the magnitude of the input signal created between differential amplifier input terminals 22 and 53 and, hence, the magnitude of the output signal increases. Thus, the gain of gain controlled amplifier 10 varies in inverse relation to the positive magnitude of the control signal applied to control terminal 58.

Figure 2:
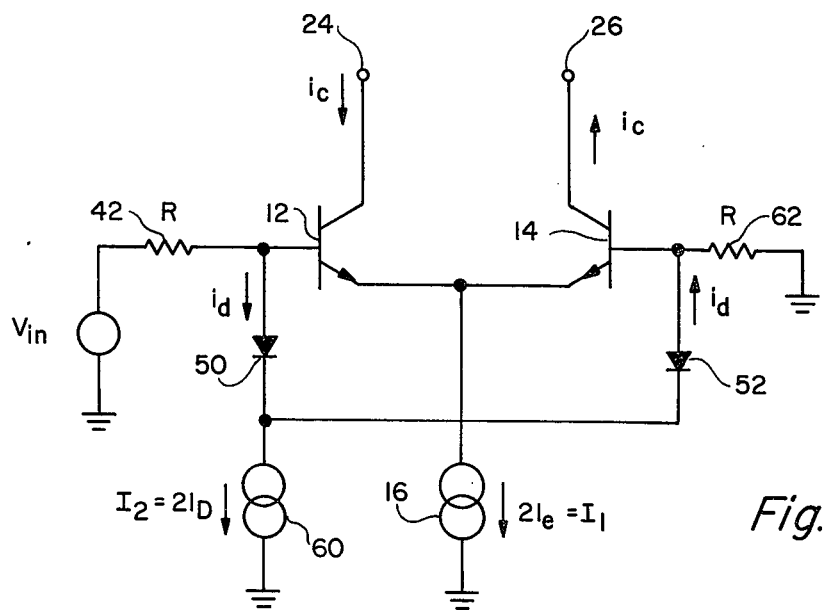
FIG. 2 is a schematic diagram useful in developing gain equations for the circuit of FIG. 1.

While gain controlled amplifier 10 is operative, transistor 54 is usually partially conductive. The current and voltage gains for gain controlled amplifier 10 of FIG. 1 with transistor 54 being at least conductive will next be mathematically derived. Referring to FIG. 2, transistor 54 is represented by current source 60 and resistor 62 represents an equivalent resistance formed from resistors 38 and 40. Since resistors 42 and 62 have equal values, they are represented by the symbol R. Diodes 50 and 52 operate as the shunt leg of a balanced L pad and produce an attenuation which varies inversely with the d.c. diode current as previously mentioned. Assuming that the diode impedance is much less than the series arm resistance R, the a.c. diode current $i_d$ of each of diodes 50 and 52 is:

$$i_d = V_{in/2R} \qquad (2)$$

The voltage $V_{bb}$ between the bases of transistors 12 and 14 is represented by the following formula wherein the quiescent current in each of the diodes $I_D$ is half the quiescent current $I_2$ conducted by current source 60.

$$V_{bb} = \frac{kT}{q} \ln \frac{I_D + i_d}{i_d} - \frac{kT}{q} \ln \frac{I_D - i_d}{i_d} \qquad (3)$$

$$= \frac{kT}{q} \ln \frac{I_D + i_d}{I_D - i_d} \qquad (4)$$

$$= \frac{kT}{q} \ln \frac{1 + i_d/I_D}{1 - i_d/I_D} \qquad (5)$$

SIMILARLY $V_{bb} = \frac{kT}{q} \ln \frac{1 + i_c/I_e}{1 - i_c/I_e} \qquad (6)$ wherein $i_c$ is the signal current flowing in transistors 12 and 14 and $I_e$ is the quiescent current in transistors 12 and 14.

Since $$\frac{1 + i_d/I_D}{1 - i_d/I_D} = \frac{1 + i_c/I_e}{1 - i_c/I_e}$$

then $$\frac{i_d}{I_D} = \frac{i_c}{I_e} \qquad (7)$$

Since $I_2 = 2I_D$, the current gain $G_i$ can be expressed as:

$$G_i = \frac{i_c}{i_d} = \frac{I_e}{I_D} = \frac{I_1}{I_2} \qquad (8)$$

As indicated by equation 8 and as previously pointed out, the current gain $G_i$ of composite gain controlled amplifier 10 varies in an inverse relation to the conductivity of transistor 54 or to the magnitude of current $I_2$. The range of attenuation obtainable by varying current $I_2$ is restricted at the high current limit by saturation of the gain control transistor 54 and at the low current limit by the restriction that the maximum ratio of the a.c. to d.c. currents for diodes 50 and 52 must be less than unity.

From equation 8 and FIG. 1, it is apparent that the differential voltage gain $G_{v2}$ of gain controlled circuit 10, assuming transistor 54 is conductive, is expressed below:

$$G_{v2} = \frac{(R_{18} + R_{20})}{(R_{38} + R_{42})} \cdot \frac{I_1}{I_2} \qquad (9)$$

From equation 7

$$i_c = i_d \frac{I_e}{I_D} \qquad (10)$$

Thus, the signal current flowing in the transistors is linearly related to that flowing in the diodes which is, in turn, linearly related to the input signal voltage irrespective of the gain. Thus the circuit does not introduce any distortion.

Figure 3:
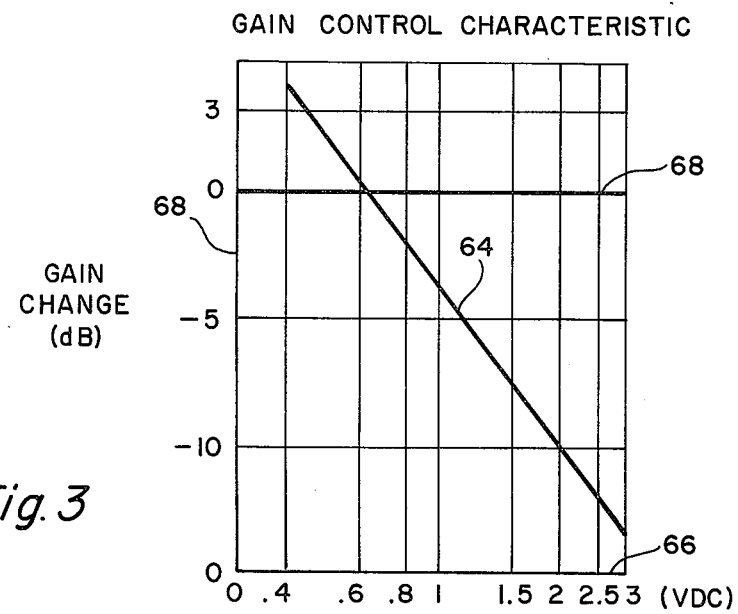
FIG. 3 is a graph of the gain control characteristic of the circuit of FIG. 1.

FIG. 3 shows the gain control transfer characteristic 64 of gain controlled amplifier 10. The control voltage magnitude is indicated along axis 66 and the gain change is indicated along axis 68. As shown, if the control voltage magnitude is doubled, the gain is halved. The transfer characteristic is linear because the exponential characteristic of the attenuation provided by the diodes matches the exponential attenuation occurring at the base electrodes of transistors 12 and 14.

The total current passing through transistors 12 and 14 is controlled by current source 16 and is therefore unaffected by changes in the gain of circuit 10. Common mode input voltage changes developed at the base of transistor 12 by diode 50 and transistor 54 and at the base of transistor 14 by diode 52 and transistor 54 in response to changes in gain are rejected. Consequently, the quiescent voltage between output terminals 24 and 26 does not vary as the gain is changed. Thus, the gain control signal at terminal 58 does not adversely affect the output signal between terminals 24 and 26. If a portion of the gain control signal did occur across output terminals 24 and 26, it could result in either undesired output signals or in undesired sounds if circuit 10 is used in a sound system. Also, gain control signal components occurring between terminals 24 and 26 could be fed back to gain control terminal 58 in some applications and cause oscillation. The constant quiescent voltage at output terminals 24 and 26 facilitate direct or noncapacitive coupling of output terminals 24 and 26 to subsequent circuits and enables the output signal to have a substantially constant maximum amplitude regardless of the gain of circuit 10.

FIG. 4 is a schematic diagram of circuit 80 which is an improved version of gain controlled amplifier circuit 10 of FIG. 1. Common reference numbers are used in FIGS. 1 and 2 to designate corresponding components. Circuit 80 has increased input impedance and virtually eliminates transient variations of the output d.c. levels at terminals 24 and 26 as input capacitor 44 charges or discharges in response to a change in magnitude of the gain control signal. These improvements are accomplished by the addition of first and second emitter follower stages. The first emitter follower stage includes transistor 82, transistor 84, resistor 86 and resistor 87. Transistor 82 includes a base electrode connected to capacitor 44 and through bias resistor 87 to voltage reference terminal 36, a collector electrode connected to positive supply voltage conductor 28 and an emitter connected to one end of resistor 42. The collector electrode of transistor 84 is connected to the emitter electrode of transistor 82 and the emitter electrode of transistor 84 is connected through resistor 86 to negative power supply conductor 34.

The second emitter follower includes transistor 88, transistor 90, resistor 92 and resistor 93. Transistor 88 includes a base electrode connected through resistor 93 to voltage reference terminal 36 and an emitter electrode connected to one end of resistor 38. Transistor 90 includes a collector electrode connected to the emitter electrode of transistor 88 and an emitter electrode connected through resistor 92 to power supply conductor 34. Resistor 95 connects the emitter of transistor 54 to conductor 34.

Current source 100 includes transistor 102, diode 104, diode 106, resistor 108 and resistor 110. Transistor 102 has a collector electrode connected to the emitters of transistors 12 and 14 and an emitter electrode connected through resistor 108 to conductor 34. Diodes 104 and 106 are connected between the base of transistor 102 and power supply conductor 34. Resistor 110, which is connected between power supply conductor 28 and diode 104, provides current to series connected diodes 104 and 106 which then provide a virtually constant base-to-emitter bias voltage to transistor 102. Since the base electrodes of transistors 84 and 90 are connected to the emitter electrode of transistor 102, diodes 104 and 106 also result in substantially constant base-to-emitter voltages for transistors 84 and 90. Series connected resistor 103 and zener diode 105, which are connected between conductors 28 and 34, provide the reference voltage at terminal 36.

Dual collector PNP transistor 112 and PNP transistor 114 form a balanced-to-unbalanced converter circuit. Transistor 112 includes an emitter electrode connected to power supply conductor 28, a base electrode connected to the emitter electrode of transistor 114, a first collector electrode connected to balanced or single-ended output terminals 24 and 116 and a second collector electrode connected to the base electrode of transistor 114. The collector electrode of transistor 114 is connected to ground and its base electrode is connected to balanced output terminal 26. The balance-to-unbalanced output circuit converts the double-ended or unbalanced output signal occurring between output terminals 24 and 26 into a single-ended or balanced output signal at terminal 116.

Gain controlled amplifiers 10 and 80 have utility in a plurality of applications. Amplifier circuit 10 provides a double-ended output signal in response to a single-ended input signal. Alternatively, amplifier 80 provides a single-ended output signal in response to a single-ended input signal. Unlike some prior art circuits, amplifiers 10 and 80 are simple in structure and easy to manufacture in monolithic integrated circuit form. Amplifiers 10 and 80 do not require separate, differentially connected current sources for the dioes 50 and 52. Differential current control is provided by transistor 54. Moreover, the quiescent output voltages at output terminals 24 and 26 remain constant to facilitate d.c. coupling and eliminate possible feedback of unwanted signal components otherwise occurring in the output signal. Since the quiescent output signal level remains constant, the maximum amount of voltage swing between the output terminals of amplifier 10 or at the output terminal of amplifier 80 is predictable and remains constant. This simplifies the design of subsequent stages being driven by amplifiers 10 and 80. Moreover, the gains of amplifiers 10 and 80 vary linearly with changes in the magnitude of the current $I_2$ conducted by gain control transistor 54. In addition, the signal transfer characteristics of the above described embodiments is linear even for input signals having large magnitudes so that virtually no output signal distortion is contributed.

It is contemplated that after having read the above description of the preferred embodiments, those skilled in the art may foresee certain alterations and modifications which have not been pointed out with particularity herein. Accordingly, this disclosure is intended as being in the nature of an explanatory illustration only and it is in no way to be considered as limiting. Therefore, the appended claims are to be interpreted as covering all modifications which fall within the true spirit and scope of the invention.

I claim:

1. An amplifier suitable for manufacture in integrated circuit form having input, control and output terminals and which changes gain in response to a gain control signal developed at the control terminal thereof, including in combination:

current supply means having a first terminal and a second terminal;

first electron control means having a first electrode connected to said first terminal of said current supply means, a control electrode coupled to an amplifier input terminal and a second electrode coupled to an amplifier output terminal;

second electron control means having a first electrode connected to said first terminal of said current supply means, a control electrode coupled to an amplifier input terminal and a second electrode coupled to an amplifier output terminal;

a third electron control means having a first electrode connected to said control electrode of said first electron control means and a second electrode, said third electron control means having an impedance which varies with the magnitude of the current passing between said first and second electrodes thereof;

a fourth electron control means having a first electrode connected to said control electrode of said second electron control means and a second electrode connected to said second electrode of said third electron control means, said fourth electron control means having an impedance which varies with the magnitude of the current conducted between said first and second electrodes thereof;

reference supply means having a first terminal coupled to said first electrodes of said third and fourth electron control means and a second terminal; and fifth electron control means having a control electrode adapted to receive the gain control signal, a first electrode connected to said second terminal of said reference supply means and to said second terminal of said current supply means, a second electrode connected to said second electrodes of said third and fourth electron control means, said fifth electron control means determining the magnitude of the currents through said third and fourth electron control means in response to the gain control signal to thereby control the gain of the amplifier.

2. The amplifier of claim 1 wherein said current supply means, said first electron control means and said second electron control means are formed from semiconductor material and provide a differential amplifier.

3. The amplifier of claim 1 wherein said first electron control means is a transistor having an emitter being said first electrode thereof, a base being said control electrode thereof, and a collector being said second electrode thereof.

4. The amplifier of claim 1 wherein said second electron control means includes a transistor having an emitter being said first electrode thereof, a base being said control electrode thereof and a collector being said second electrode thereof.

5. The amplifier of claim 1 wherein said third and fourth electron control means are semiconductor diodes having anode and cathode regions.

6. The amplifier of claim 5 wherein said anode regions of said diodes are said first electrodes of said third and fourth electron control means, and said cathode regions of said diodes are said second electrodes of said third and fourth electron control means.

7. The amplifier of claim 4 wherein said fifth electron control means is a transistor having emitter, base and collector regions, said base region of said transistor being said control electrode of said fifth electron control means, said emitter region being said first electrode and said collector region being said second electrode.

8. The amplifier of claim 1 further including in combination:
   first buffer amplifier means having an input terminal adapted to receive a signal to be amplified and an output terminal;
   first resistive means connecting said output terminal of said first buffer amplifier means to said control electrode of said first electron control means;
   second buffer amplifier means having an input electrode coupled to said first terminal of said reference supply means and an output terminal; and
   second resistive means connecting said output terminal of said second buffer amplifier means to said control electrode of said second electron control means.

9. In a differential amplifier having a current supply with first and second terminals, a first transistor having an emitter electrode connected to the first terminal of the current supply, a base electrode connected to an amplifier input terminal and a collector electrode connected to an amplifier output terminal, a second transistor having an emitter electrode connected to the first terminal of the current supply, a base electrode connected to another amplifier input terminal and a collector electrode connected to another amplifier output terminal, a gain control circuit including in combination:
   first semiconductor diode means having a first electrode connected to the base electrode of the first transistor and a second electrode, said first diode means having an impedance which varies with the magnitude of a current passing between said first and second electrodes thereof;
   said semiconductor diode means having a first electrode connected to the base electrode of the second transistor and a second electrode connected to said second electrode of said first diode means, said second diode means also having an impedance which varies with the magnitude of the current conducted between said first and second electrodes thereof;
   reference supply means having a first terminal and a second terminal, said first terminal being coupled to said first electrode of said first and second diode means; and
   gain control transistor means having a base electrode adapted to receive a gain control signal, an emitter electrode connected to said second terminal of said reference supply means and a collector electrode connected to said second electrodes of said first and second diode means, said gain control transistor means determining the magnitude of said currents passing through said first and second diode means in response to the magnitude of the gain control signal to thereby control the gain of the differential amplifier.

10. A gain controlled circuit having an input terminal, an output terminal, and a single control terminal, the gain controlled circuit having a variable gain that is a linear function of the magnitude of a gain control signal, comprising:
   amplifier means having first and second input terminals, at least one output terminal and a common terminal, said output terminal of said amplifier means being coupled to the output terminal of the gain controlled circuit;
   first circuit means coupling said first input terminal of said amplifier means to the input terminal of the gain controlled circuit;
   second circuit means coupling said second input terminal of said amplifier means to the input terminal of the gain controlled circuit; and
   shunt gain control means for linearly varying the gain of the gain controlled circuit in response to the gain control signal, said shunt gain control means having a control electrode, first and second terminals and a common terminal, said first and second terminals of said shunt gain control means being respectively connected to said first and second input terminals of said amplifier means, said common terminal of said shunt gain control means being connected to said common terminal of said amplifier means and said control electrode of said shunt gain control means being the single control terminal of the gain controlled circuit.

11. The gain controlled circuit of claim 10 wherein said amplifier means includes a differential amplifier.

12. The gain controlled circuit of claim 10 wherein said shunt gain control means includes in combination:
   first electron control means having first, second and control electrodes, said control electrode being the control terminal of the gain controlled circuit, and said first electrode being connected to the common terminal of said shunt gain control means;
   second electron control means having first and second electrodes, said first electrode being connected to said first terminal of said shunt gain control means, and said second electrode being connected to said second electrode of said first electron control means;

third electron control means having first and second electrodes, said first electrode being connected to said second terminal of said shunt gain control means, and said second electrode being connected to said second electrode of said first electron control means;

reference supply means including first and second terminals, said first terminal of said reference supply means being coupled to said first electrodes of said second and third electron control means, and said second terminal of said reference supply means being connected to said common terminal; and said second and third electron control means having an electrical conductance which is responsive to the magnitude of the current conducted from said reference supply means through said second and third electron control means and said first electron control means to provide linear gain control.

13. The gain controlled circuit of claim 10 wherein said first and second circuit means include resistive means.

14. The gain control circuit of claim 12 wherein said first electron control means includes a transistor having emitter base and collector electrodes, said emitter electrode being said first electrode, said collector electrode being said second electrode, and said base electrode being said control electrode.

15. The gain controlled circuit of claim 14 wherein said second and third electron control means each include a semiconductor diode each having anode and cathode electrodes, said first electrodes of said second and third electron control means being said anodes and said second electrodes of said second and third electron control means being said cathodes.

16. The gain controlled circuit of claim 10 wherein:

said second circuit means includes first and second resistive means connected in series and having a junction point therebetween;

said amplifier means includes a differential amplifier; and said shunt gain control means includes a transistor having base, collector and emitter electrodes, said base electrode being the control terminal of the gain controlled circuit, said emitter electrode being connected to said common terminal, first and second semiconductor diodes each having anode and cathode electrodes, said anode of said first diode being connected to said first terminal of said shunt gain control means, said anode of said second diode being connected to said second terminal of said shunt gain control means, and said cathodes of said first and second diodes being connected to said collector electrode of said transistor and reference supply means having first and second terminals, said first terminal of said reference supply being connected to said second circuit means at said junction point and said second terminal of said reference supply being connected to said common terminal.

* * * * *